United States Patent
Freyman et al.

[11] Patent Number: 5,828,251
[45] Date of Patent: *Oct. 27, 1998

[54] POWER-UP DETECTOR CIRCUIT

[75] Inventors: Ronald Lamar Freyman, Bethlehem; Michael James Hunter, Boyertown, both of Pa.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 674,411

[22] Filed: Jul. 2, 1996

[51] Int. Cl.$^6$ ....................................................... H03L 7/00
[52] U.S. Cl. .............................. 327/143; 327/80; 327/198
[58] Field of Search ...................................... 327/142, 143, 327/198, 50, 51, 328, 80

[56] References Cited

U.S. PATENT DOCUMENTS

| | | | |
|---|---|---|---|
| 4,366,560 | 12/1982 | McDermott et al. | 365/228 |
| 4,797,584 | 1/1989 | Aguti et al. | 327/143 |
| 5,027,320 | 6/1991 | Pathak et al. | 365/185 |
| 5,109,163 | 4/1992 | Benhamida | 327/143 |
| 5,396,115 | 3/1995 | Coffman et al. | 327/143 |
| 5,528,184 | 6/1996 | Gola et al. | 327/143 |

*Primary Examiner*—Timothy P. Callahan
*Assistant Examiner*—Jung Ho Kim
*Attorney, Agent, or Firm*—James H. Fox

[57] ABSTRACT

An integrated circuit includes a power-up detector circuit that includes a node that is held at a charged state by a capacitor during normal operation. The voltage on the node is sensed by a sensing circuit, typically an inverter that produces a power-up reset pulse when power is initially applied. However, the voltage on the node may not properly discharge in all cases during brief power interruptions. Therefore, to increase the reliability of the power-up detector, a discharge circuit is included to help ensure that the voltage sensed by the power supply voltage-sensing circuit is at the proper level when the power supply voltage drops below a given level. The discharge circuit comprises a first capacitor that turns on a node discharge transistor when the power supply voltage drops below the given level. To provide protection against false discharge, a second capacitor is optionally provided that prevents the discharge transistor from conducting during very brief power supply voltage interruptions. In a preferred embodiment, the second capacitor is effectively disabled at low power supply voltages. This facilitates conduction of the discharge transistor for power supply voltage interruptions resulting from slow changes (low slew rate) in the power supply voltage.

5 Claims, 1 Drawing Sheet

POWER-UP DETECTOR CIRCUIT

BACKGROUND OF THE INVENTION

1. Field of the Invention

The present invention relates to a power-up detector circuit.

2. Description of the Prior Art

Power-up detector circuits are often included in integrated circuit (IC) designs, to provide a reset signal that initializes the various portions of the circuitry when power is applied to the IC. For example, the reset signal may be used to ensure that logic circuitry is initialized without floating gate nodes that could lead to excessive power consumption. Furthermore, a microprocessor, digital signal processor, or microcontroller, referred to collectively herein as a "digital processor", often includes a power-up detector so that the logic circuitry is initialized to accept logic input signals as valid software instructions. Various other circuitry may be initialized for still other purposes. Note that the power-up may be after a long duration power-down, or may be due to a momentary disruption of the power supply voltage, as in the case of portable battery-powered equipment. To accommodate the various types of power-down conditions and disruptions, the power-up detector should reliably generate a reset signal, without generating false reset signals, under a wide variety of situations. For example, variations relating to power supply voltage levels, and the rate of voltage rise (during power on) and voltage fall (during power down) should be accommodated.

Referring to FIG. 1, one prior-art power-up detector (100) is illustrated that monitors the power supply voltage difference between the power supply node $V_{DD}$ and the ground power supply node $V_{SS}$. When power is initially applied, the voltage at node 103 rises due to conduction through transistor 101, thereby storing charge on capacitor-connected transistor 102. When the voltage reaches the switching threshold of the voltage-sensing inverter comprising transistors 105 and 106, the voltage on inverter output node 107 goes low, causing transistor 104 to conduct. Therefore, transistor 104 holds node 103 high as long as sufficient voltage across the $V_{DD}$ and $V_{SS}$ nodes is present. It can be seen that the latched high voltage on node 103 (and low voltage on node 107) causes the output of the inverter formed by transistors 108 and 109 to be high, causing the output of the inverter formed by transistors 110 and 111 to be low, and causing the output node 114 of the inverter formed by transistors 112 and 113 to be high. Hence, the signal JPURA may be used to control a reset function, or for still other purposes (e.g., sounding an alarm) as desired.

Note also that since the power-up detector must itself be powered in order to operate, it needs to function reliably at a voltage no greater than that required for the operational circuitry that it controls. In particular, a problem has been found in prior-art designs as CMOS technology migrates to smaller design rules and lower transistor thresholds. That is, as the threshold ($V_{tn}$) of transistor 106 is reduced, brief power outages may not be reliably detected. This is because the forward-bias voltage across the p-n junction formed by the p+ drain of transistor 104 and its n-doped substrate (e.g., n-tub) may be greater than the switching threshold of the inverter comprising transistors 105 and 106. For example, the parasitic diode 115 will typically have a junction voltage drop of 0.6 volts, whereas the switching threshold of inverter 105-106 may be about 0.5 volts or less in 0.5 micron technology. The n-type substrate (e.g., n-tub) in which diode 115 is formed is normally biased at $V_{DD}$ during operation, and so no voltage clamping occurs due to diode 115 in normal operation. However, in the case of brief power outages, the voltage on node 103 will be clamped at approximately 0.6 volts by diode 115, which is above the switching threshold of the first inverter (105, 106). Therefore, the output signal JPURA will not switch to a low voltage state during such brief power interruptions, and the control circuitry will not properly reset. During more extended outages, sub-threshold leakage through diode 115 will bring the voltage on node 103 below the switching threshold, and proper reset will occur on the next power-up.

SUMMARY OF THE INVENTION

We have invented a power-up detector circuit that includes a discharge circuit which helps ensure that the voltage sensed by a power supply voltage-sensing circuit is at the proper level when the power supply voltage drops below a given level. The discharge circuit comprises a first capacitor that turns on a node discharge transistor when the power supply voltage drops below the given level. To provide protection against false discharge, a second capacitor is optionally provided that prevents the discharge transistor from conducting during very brief power supply voltage interruptions. In a preferred embodiment, the second capacitor is effectively disabled at low power supply voltages. This facilitates conduction of the discharge transistor for power supply voltage interruptions resulting from slow changes (low slew rate) in the power supply voltage.

DETAILED DESCRIPTION

Figure 1:
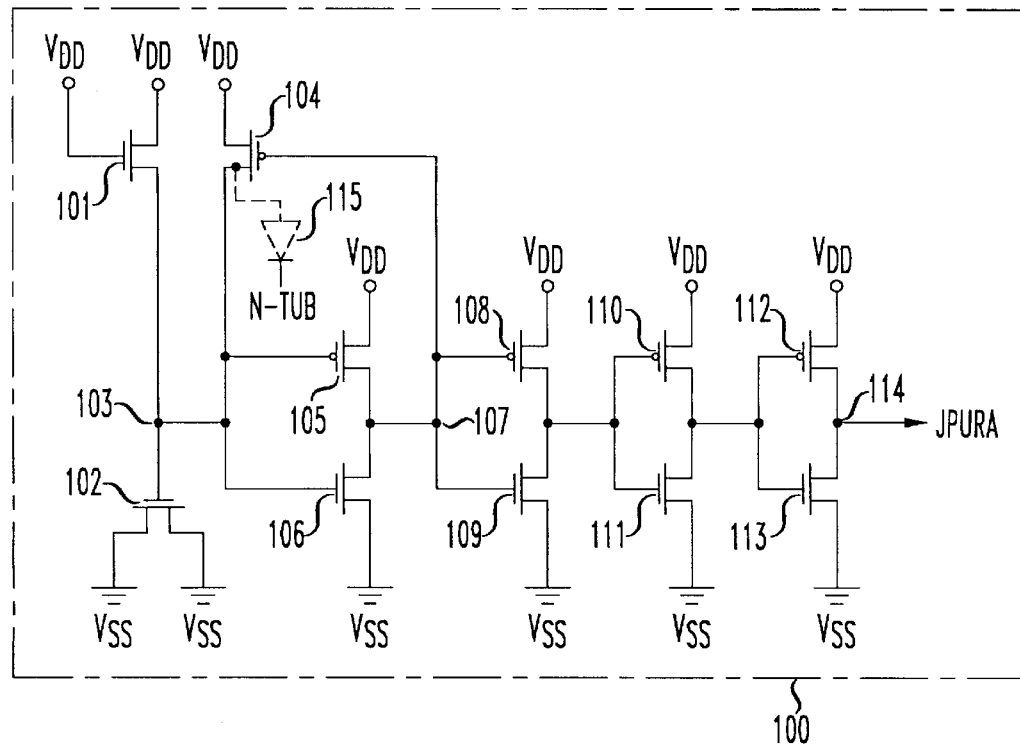
FIG. 1 shows an embodiment of a prior-art power-up detector circuit.
Figure 2:
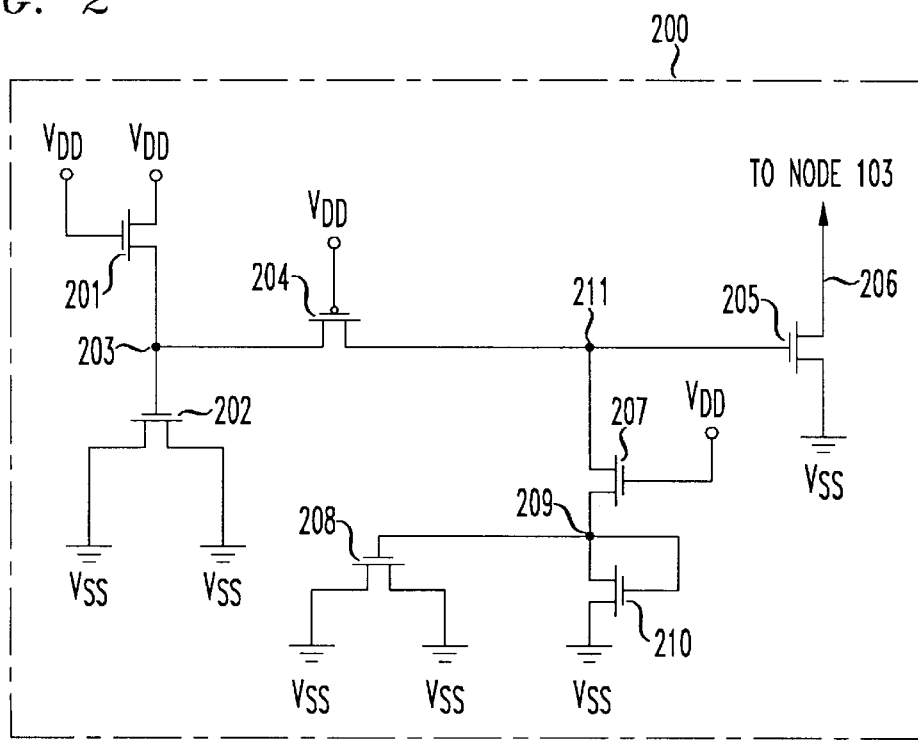
FIG. 2 shows a preferred embodiment of a discharge circuit that may be used to improve the operation of a power-up detector as shown illustratively in FIG. 1.

The following detailed description relates to an improved power-up detector circuit. Referring to FIG. 2, a discharge circuit 200 is illustrated that improves the performance of a power-up detector. The use of the inventive circuit is illustrated with respect to the prior-art circuit of FIG. 1, but use with other power-up detectors is possible. The discharge circuit 200 provides a discharge line 206 which connects to a sensed voltage node, being illustratively the node 103 in FIG. 1. The discharge line is controlled by discharge transistor 205, such that when the gate of 206 is above a transistor switching threshold ($V_{tn}$), line 206 pulls the sensed node 103 low.

The gate of 205, connected to node 211, is firstly controlled by the circuitry comprising transistor 201, capacitor 202, and transistor 204. When the power supply voltages ($V_{DD}$, $V_{SS}$) are applied to the integrated circuit, the capacitor formed by transistor 202 is charged through transistor 201, which is connected as a diode. Therefore, node 203 is placed at a high voltage state of approximately $V_{DD}-V_{tn}$. This voltage is isolated from node 211 by transistor 204 as long as $V_{DD}$ is sufficiently high at the gate of transistor 204 to prevent it from conducting. Therefore, node 211 will remain below the conduction threshold of transistor 205, due to leakage of any charge from node 211 to $V_{SS}$ through transistors 207 and 210. However, during an interruption of the power supply voltage $V_{DD}$, the voltage on the gate of transistor 204 may fall more than $V_{tp}$ below the voltage on node 203, so that transistor 204 will conduct. Therefore, the charge stored on node 203 by capacitor 202 will be shared with node 211, pulling the voltage on the gate of transistor 205 above its conduction threshold. Hence, line 206 will pull the sensed voltage node 103 low, so that the power supply reset signal JPURA goes high, as noted above. In this manner, the reliability of sensing a loss of power supply voltage is increased, due to the charge stored across capacitor 202.

However, still additional reliability can be obtained by the inclusion of capacitor 208, transistor 207, and diode-connected transistor 210. The capacitor 208 serves to filter out rapid changes at node 211 due to noise voltages, in order to prevent the false discharge of sensed node 103. In this manner, false triggering of the reset circuitry may be avoided. The diode-connected transistor 210 serves to limit the bias of node 209 at one transistor threshold ($V_{tn}$) above ground ($V_{SS}$) during the initial power up ramp. Furthermore, it helps maintain this bias during any subsequent power supply drops of $V_{tn}+V_{tp}$ (through transistors 201 and 204) below the expected $V_{DD}$. Therefore, the gate of discharge transistor 205 is held at a level approximating its conduction threshold during normal operation, allowing transistor 205 to conduct rapidly in case of a power supply failure.

The transistor 207 serves as a switching device to isolate the effect of the capacitor 208 on node 211 when the power supply voltage is less than two $V_{tn}$ above $V_{SS}$. That is, at relatively low values of $V_{DD}$, the gate of transistor 207 is below its conduction threshold, effectively disconnecting capacitor 208 from node 211. This acts to allow the turning on of transistor 204 to more rapidly increase the node voltage on node 211. This pronounced rise on node 211 turns on transistor 205 strongly, which in turn pulls node 103 past the switching point of the inverter 105–106, thereby causing a reset pulse to occur. The net effect is to improve the response of the discharge circuit 200 in the case of a power supply failure that is initiated from a relatively low power supply voltage.

The invention claimed is:

1. An integrated circuit having a power-up detector comprising a charging device (101) coupled between a power supply voltage conductor ($V_{DD}$) and a capacitor (102) that maintains a voltage on a sensed voltage node (103) during operation of said integrated circuit, and wherein said sensed voltage node (103) is coupled to a voltage clamping device (115) that clamps the voltage on said node when the power supply voltage ($V_{DD}$) is removed, and said sensed voltage node (103) is also coupled to a voltage sensing circuit (105, 106) having a threshold voltage;

characterized in that said power-up detector further comprises a discharge circuit (200) having an enhancement-mode discharge transistor (205) for discharging the voltage on said sensed voltage node (103) when said power supply voltage is removed;

wherein said discharge circuit comprises a first capacitor (202) that is charged to a given voltage level by a charging device (201) when said power supply voltage ($V_{DD}$) is applied, and that is also coupled to the control terminal of a discharge device (205), whereby said discharge device conducts to discharge said sensed voltage node (103) when said power supply voltage is removed;

wherein said discharge circuit further comprises a second capacitor (208) for reducing the effect of noise voltages on the control terminal of said discharge device (205); and wherein said discharge circuit discharges the voltage on said sensed voltage node to a level below said threshold voltage of said voltage sensing circuit.

2. An integrated circuit having a power-up detector compromising a sensed node (103) coupled to a capacitor (102) for storing charge conducted through a charging transistor (101) from a power supply voltage conductor ($V_{DD}$), wherein said sensed node (103) is also coupled to the input of a voltage sensing inverter (105, 106) having an output coupled to the input of a feedback transistor (104) that pulls said sensed node toward the voltage on said power supply voltage conductor when said sensed node is in a high voltage state, characterized in that power-up detector further comprises a discharge circuit (200) for discharging said sensed node when said power supply voltage is removed, wherein said discharge circuit said sensed voltage node to a level below the switching threshold voltage of said voltage sensing circuit (105, 106) by means of a first capacitor (202) that is charged to a given voltage level by a charging device (201) when said power supply voltage ($V_{DD}$) is applied, and that is also coupled to the control terminal of a discharge device (205), whereby said discharge device conducts to discharge said sensed voltage node (103) when said power supply voltage ($V_{DD}$) is removed.

3. The invention of claim 2 wherein said discharge circuit further comprises a second capacitor (208) for reducing the effect of noise voltage on the control terminal of said discharge device (205).

4. The invention of claim 3 wherein said discharge circuit further comprises a biasing device (210) for biasing said control terminal of said discharge device (205) to a voltage approximating the conduction threshold voltage of said discharge device.

5. The invention of claim 4 wherein said discharge circuit further comprises a switching device (207) for isolating said second capacity (208) from the control terminal of said discharge device (205) at a relatively low power supply voltages.

* * * * *